(12) United States Patent
Friedman et al.

(10) Patent No.: US 11,875,839 B2
(45) Date of Patent: Jan. 16, 2024

(54) FLOW BASED RATE LIMIT

(71) Applicant: Intel Corporation, Santa Clara, CA (US)

(72) Inventors: Ben-Zion Friedman, Jerusalem (IL); Eliezer Tamir, Bait Shemesh (IL); Manasi Deval, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1105 days.

(21) Appl. No.: 15/589,893

(22) Filed: May 8, 2017

(65) Prior Publication Data
US 2018/0322913 A1 Nov. 8, 2018

(51) Int. Cl.
| | | |
|---|---|---|
| *G06F 13/14* | (2006.01) | |
| *G11C 11/4076* | (2006.01) | |
| *G06F 12/06* | (2006.01) | |
| *G06F 13/16* | (2006.01) | |
| *G06F 13/42* | (2006.01) | |

(Continued)

(52) U.S. Cl.
CPC ........ *G11C 11/4076* (2013.01); *G06F 12/063* (2013.01); *G06F 12/0653* (2013.01); *G06F 13/1626* (2013.01); *G06F 13/4217* (2013.01); *G11C 8/18* (2013.01); *G06F 11/00* (2013.01); *G06F 12/02* (2013.01); *G11C 8/00* (2013.01)

(58) Field of Classification Search
CPC .... G06F 13/00; G06F 12/063; G06F 12/0653; G06F 13/1626; G06F 13/4217; G06F 11/00; G06F 12/02; G11C 11/4076; G11C 8/18; G11C 8/00

USPC .................................. 710/305–306, 100, 29
See application file for complete search history.

(56) References Cited

U.S. PATENT DOCUMENTS

| | | | | |
|---|---|---|---|---|
| 7,606,154 B1 * | 10/2009 | Lee | ......................... | H04L 47/30 370/232 |
| 7,729,387 B2 * | 6/2010 | Beck | ..................... | H04J 3/0632 370/518 |

(Continued)

OTHER PUBLICATIONS

"Quality of Service (QoS) Overview", Applies to: Windows Server 2012, https://docs.microsoft.comien-usiprevious-iersions/windowslit-prolwindows-server-2012-r2-and-2012/hh831679(v=ws.11), Aug. 31, 2016, 8 pages.

(Continued)

*Primary Examiner* — Henry Tsai
*Assistant Examiner* — Kim T Huynh
(74) *Attorney, Agent, or Firm* — Compass IP Law PC (57) ABSTRACT

Disclosed is a mechanism maintain flow rate limits to flows in a server operating in a single root input/output virtualization (SR-IOV) environment. A transmit pipeline assigns a dedicated transmit queue to a flow. A scheduler allocates a flow transmit bandwidth to the dedicated transmit queue to enforce the flow rate limit. The transmit pipeline assigns the dedicated transmit queue to the flow upon receiving a packet of the flow. A queue identifier (ID) for the dedicated transmit queue is forwarded to a tenant process acting as a source of the flow to support forwarding of packets of the flow to the proper transmit queue. The transmit pipeline maintains security by comparing packet destinations of packets with the destination of the flow associated with the dedicated transmit queue. Packets in the dedicated destination queue with destinations that do not match the flow destination may be dropped.

26 Claims, 6 Drawing Sheets

(51) Int. Cl.
  *G11C 8/18* (2006.01)
  *G06F 11/00* (2006.01)
  *G06F 12/02* (2006.01)
  *G11C 8/00* (2006.01)

(56) References Cited

U.S. PATENT DOCUMENTS

| | | | | |
|---|---|---|---|---|
| 9,213,564 | B1* | 12/2015 | Klein | G06F 9/45558 |
| 2004/0228291 | A1* | 11/2004 | Huslak | H04N 7/152 |
| | | | | 370/352 |
| 2005/0240695 | A1* | 10/2005 | Leaming | G06K 19/07 |
| | | | | 710/100 |
| 2006/0062249 | A1* | 3/2006 | Hall | E21B 47/12 |
| | | | | 370/468 |
| 2008/0101354 | A1* | 5/2008 | Arndt | H04L 47/23 |
| | | | | 370/235 |
| 2013/0111077 | A1* | 5/2013 | Gowravaram | G06F 13/28 |
| | | | | 710/22 |
| 2014/0086259 | A1* | 3/2014 | Venables | H04L 47/527 |
| | | | | 370/412 |

OTHER PUBLICATIONS

"QoS Minimum Bandwidth Best Practices", Applies to: Windows Server 2012, https://docs.microsoft.com/en-us/previous-versions/Windows/it-pro/Windows-server-201242-and-2012/jj735303(v=ws_11), Aug. 31, 2016, 10 pages.

Intel "Open vSwitch* with Data Plan Development Kit Part 1: Quality of Service Configuration", https://www.intel.com/content/www/us/en/developer/articles/technical/gos-configuration-and-usage-for-open-vswitch-with-dpdk.html, published Apr. 27, 2016, 6 pages.

\* cited by examiner

FLOW BASED RATE LIMIT

BACKGROUND

In a cloud network environment, multiple entities communicate via common channels. For example, various software entities may operate on common hardware. Hence, such entities must share the hardware in a manner that allows each entity to perform its intended functions without undue delay. Various communication protocols allow for communication of data between entities across a cloud network. However, routing data for each entity without consideration of communications of other entities may result in traffic congestion, communication delays, and/or data loss in the form data dropped due to memory space constraints, time out, etc.

BRIEF DESCRIPTION OF THE DRAWINGS

The concepts described herein are illustrated by way of example and not by way of limitation in the accompanying figures. For simplicity and clarity of illustration, elements illustrated in the figures are not drawn to scale unless otherwise noted.

DETAILED DESCRIPTION OF THE DRAWINGS

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, such feature, structure, or characteristic can be employed in connection with another disclosed embodiment whether or not such feature is explicitly described in conjunction with such other disclosed embodiment.

The disclosed embodiments may be implemented, in some cases, in hardware, firmware, software, or any combination thereof. The disclosed embodiments may also be implemented as instructions (e.g. a computer program product) carried by or stored on one or more transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

In a virtualized cloud service provider network, a hypervisor layer may provide communication services such as packet monitoring, metering, and modifications based on tunneling schemes/rules. At higher speeds (e.g. greater than 40 gigabits per second (Gbps)), single root input/output virtualization (SR-IOV) is employed to isolate and dedicate Peripheral Component Interconnect Express (PCI-E) resources to corresponding tenant processes. In such systems, the system hardware may perform the communication services in a trusted mode to increase speed. Such services may include applying access control lists (ACL) to drop or allow communication flows based on control plane policy, managing tunnel endpoints to modify packet headers to include tunnel information, and providing rate limits and/or bandwidth guarantees to communication flows based on quality of service (QoS) requirements. Such rate limiting may be employed to manage network congestion. For example, port rate limiting may limit the amount of data being communicated across a port from a specified server. Further, a tenant rate limit may be applied to limit the amount of data being communicated by a specified tenant process by limiting the amount of data communicated from the tenant process. However, cases may occur when finer grain rate limiting may be desired. For example, a tenant process (e.g. virtual machine (VM), container, etc.) may simultaneously maintain multiple communication flows with multiple destinations. In such cases, a particular flow may cause network congestion downstream even though both port and tenant rate limits are satisfied for the corresponding tenant. Rate limiting on a flow by flow basis presents certain challenges. For example, allowing each tenant to rate limit its own flows may be undesirable because such a scheme would require that each tenant be considered a trusted entity. Such a scheme would provide security concerns in the event a tenant becomes compromised by malicious code and presents a danger to other tenants. Further, a pure hardware implementation for rate limiting may be undesirable because the hardware components must review a packet header prior to determining to which flow the packet belongs. As such, a certain amount of pre-processing of the packets must take place prior to scheduling, resulting in a need to employ dual schedulers, significant on-die storage for partially fetched and deferred packets, and a complex processing structure. Further, such a scheme may output packets out of order unless some multi-scheduler coordination mechanism is employed.

Disclosed herein is a flow based rate limiting mechanism that overcomes the abovementioned concerns. The flows are assigned a corresponding dedicated transmit queue based on flow destination. Flow rate limits can then be applied to the queues to control the transmit rate of the flows contained in the queues. A transmit pipeline and a scheduler in a network interface card may be employed to implement the flow rate limits. The transmit pipeline and the scheduler receive a flow rate for a flow from a hypervisor. When a first packet for the flow is received by the transmit pipeline, the transmit pipeline assigns a dedicated transmit queue to the flow. For example, a parser in the transmit pipeline determines a connection entry identifier (ID) associated with the flow and maps the connection entry ID to a queue ID of the dedicated transmit queue. The transmit queue ID is then forwarded back to the tenant process acting as a source for the flow. The tenant process directs the flow to the dedicated transmit queue based on the transmit queue ID. The scheduler allocates a flow transmit bandwidth to the dedicated transmit queue to enforce the flow rate limit. The flows are assigned to dedicated transmit queues based on source and destination tuples, tunnel IDs, etc. Further, the transmit pipeline may enforce security on the flows traversing the dedicated transmit queues. For example, the transmit pipeline may compare packet destination to the destination of the flow assigned to the dedicated transmit queue. If the destinations are different, then the packet is potentially malicious (e.g. attempting to avoid a flow rate limit) and can be dropped. Repeated packet drops may indicate a compromised tenant process, and the transmit pipeline may discontinue service to the tenant and provide an alert to an administrator to maintain the integrity of the rest of the network.

Figure 1:
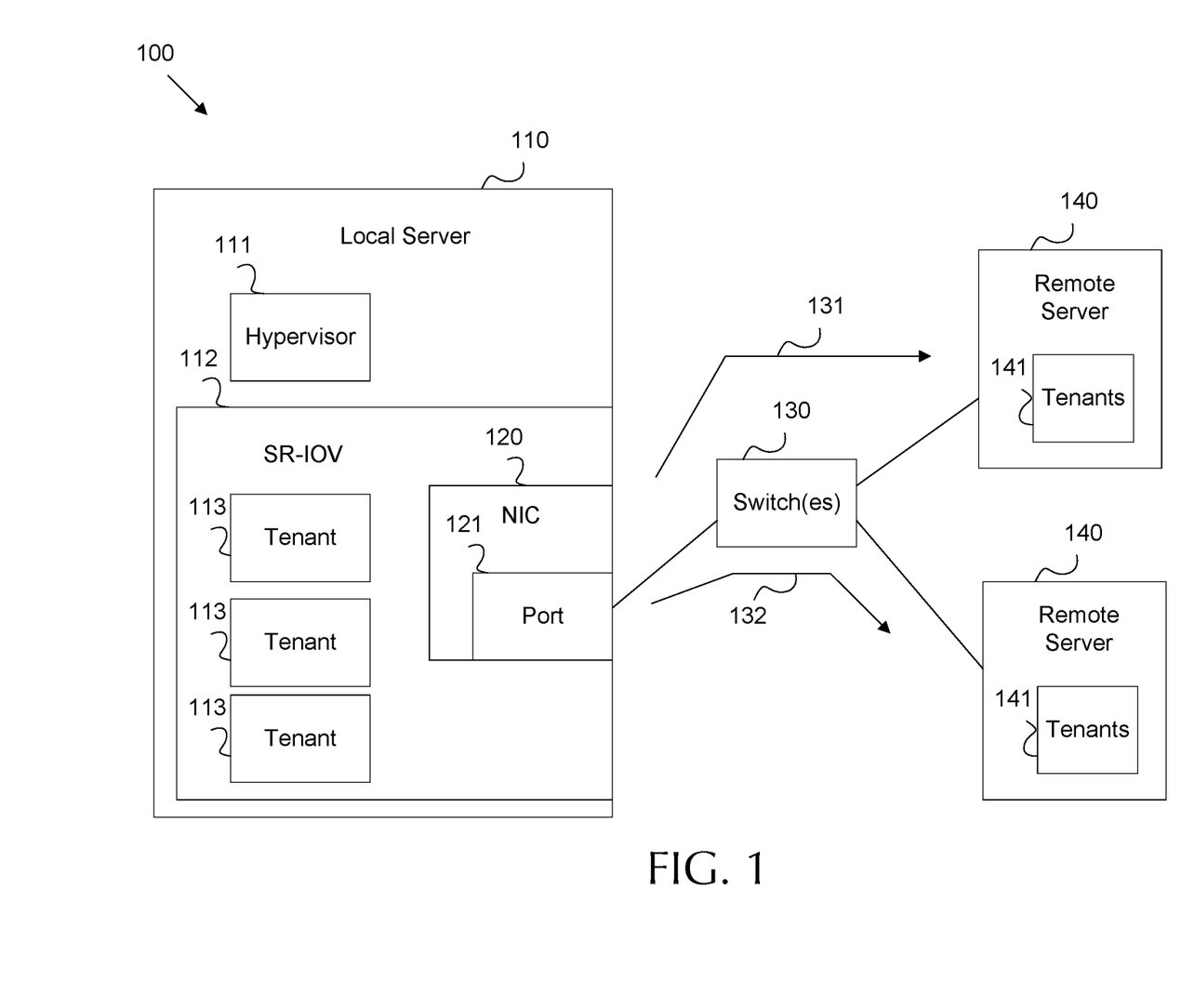
FIG. 1 is a schematic diagram of an example of a cloud network.

FIG. 1 is a schematic diagram of an example of a cloud network 100, which may be hosted in a data center. It should be noted that cloud network 100 is simplified for clarity of discussion and that an operational cloud network employs additional components not shown in FIG. 1. The cloud network 100 provides network services to tenant processes 113 and/or end users. Such services may include computing services, security services, storage services, communication services, hosting services, etc. The cloud network 100 includes servers, such as a local server 110 and remote servers 140 coupled via a network of switches 130. The servers may also be coupled via additional routers, gateways, electrical cables, optical cables, etc. The local server 110 includes a hypervisor 111 to manage system virtualization. The local server 110 operates in SR-IOV 112 mode, and hence provides dedicated communication resources (e.g., VMs) for tenant processes 113. The tenant process 113 communicates outside of local server 110 via a network interface card (NIC) 120 coupled to one or more ports 121.

A local server 110 may be a computing device that provides computing and/or memory storage services. The local server 110 includes various hardware resources to provide such services. For example, such hardware resources may include processors, application specific circuits (ASICs), field programmable gate arrays (FPGAs), cache memory, read only memory (ROM), random access memory (RAM), network communication resources, etc. The local server may be employed for operating a plurality of tenant processes 113 (e.g. VMs, containers, applications, etc.) on hardware resources. The local server 110 employs tenants 113 to execute instructions to provide the local server's 110 services. The tenant processes 113 may be partitioned and/or virtualized components that operate by employing the local server's 110 hardware resources. For example, the tenant processes 113 may include VMs, containers, etc. The local server 110 may operate in SR-IOV 112 mode. SR-IOV 112 is a hardware operating mode where communication related hardware resources, such as PCI-E communication resources, are isolated and dedicated to corresponding tenants 113 to increase operational speed. Specifically, SR-My 112 is a specification that allows multiple processes to employ a single PCI-E interface while bypassing direct access to a corresponding hypervisor 111. This allows a reduction in signaling overhead and increases communication speed. The local server 110 may operate a hypervisor 111. The hypervisor 111 is a software, firmware, and/or hardware component that creates, manages, and/or operates tenant processes 113. The hypervisor 111 may act as an operating platform for the tenant processes 113. For example, the hypervisor 111 may create, configure, manage, and/or delete tenant processes, for example by allocating and configuring the communication hardware resources for the tenants by managing SR-IOV 112.

The tenant processes 113 communicate with remote entities outside of the local server 110 via a network interface card (NIC) 120. The NIC 120 may be coupled to the local server 110. For example, the NIC 120 may be coupled to hardware resources operating the tenant processes 113, in some cases via PCI-E bus. The NIC 120 is any computer hardware component that couples a computer, such as local server 110, to a network. The NIC 120 includes a transmit pipeline for processing packets from tenant processes 113 during transmission over the network, for example to remote servers 140. The NIC 120 also includes a receive pipeline for processing packets received via the network, for example from the remote servers 140. The NIC 120 also includes memory organized in queues for storing packets being transmitted and/or received during processing. The NIC 120 also includes one or more ports 121. A port 121 is an endpoint of a communication. The port 121 may be a hardware connector and/or a logical component operating on hardware that identifies a process and/or network service. For example, a port 121 may be divided into a plurality of logical ports, associated with an address, such as an internet protocol (IP) address, and corresponding port numbers associated with specified network services. Ports 121 may be shared by tenant processes 113 for communicating data across the network.

A remote server 140 may be substantially similar to a local server 110. It should be noted that the terms local and remote are labels employed for purposes of clarity of discussion. As used herein, local indicates a communicating entity while remote indicates a correspondent entity that exchanges data with the communicating entity. The remove servers 140 contain tenant processes 141, which are substantially similar to tenant processes 113. Tenant processes 113 and 141 communicate via a network of switches 130. A switch 130 may be any network components that forwards packets/frames and/or flows 131-132 of packets/frames between servers 110 and 140, for example via electrical and/or optical cables. A flow 131-132 is any sequence of related packets/frames between common end points, for example as part of a communication session between a local tenant process 113 and a remote tenant process 141.

Network congestion may occur across a network of switches 130 when communications between a specified set of end points monopolize network resources by employing too much bandwidth to the detriment of communications between other end points. Rate limiting is employed to reduce congestion by maintaining a maximum data transfer over time between endpoints, which enforces fairness between communications. For example, a port rate limit enforces a maximum limit of bandwidth that can be allocated to communications traversing a port 121. The port rate limit ensures that the local server 110 does not monopolize bandwidth to the detriment of other unrelated servers communicating across the network 100. Further, a tenant rate limit may be employed as a sub-set of the port rate limit. The tenant rate limit enforces a maximum limit of bandwidth that can be allocated to a specified tenant process 113. The tenant rate limit ensures that no tenant process 113 monopolize bandwidth to the detriment of other tenant process 113.

The NIC 120 also enforces a per flow 131-132 rate limit. In some cases congestion may occur in the switches 130 due to a flow 131 or 132 employing a large portion of the bandwidth allocated to local server 110 and tenant process 113. For example, flows 131-132 between a tenant process 113 and a tenant process 141 may comply with a port rate limit and a tenant rate limit when considered together. However, flow 131 may employ most of the bandwidth allocated to the port 121 and the tenant process 113, while may flow 132 employ a relatively small amount of bandwidth. Such a scenario may result in congestion along a network path transporting flow 131 and an underutilization of a network path transporting flow 132. A flow rate limit (e.g. a communication bandwidth rate limit applied on a per flow basis) allows an individual flow, such as flow 131, to receive a limited bandwidth allocation to address congestion that is specific to the flow. Example mechanisms to implement a flow rate limit are discussed in more detail below.

It should be noted that cloud network 100 is depicted as a greatly simplified diagram for purposes of discussion of the embodiments disclosed herein. One of skill in the art will recognize that cloud network 100 contains many additional components that are not directly relevant to the embodiments discussed herein. Such components may still be desirable for proper operation of cloud network 100. The disclosure should be interpreted as including all such components and/or features as desired to support the operation of the embodiments disclosed herein.

Figure 2:
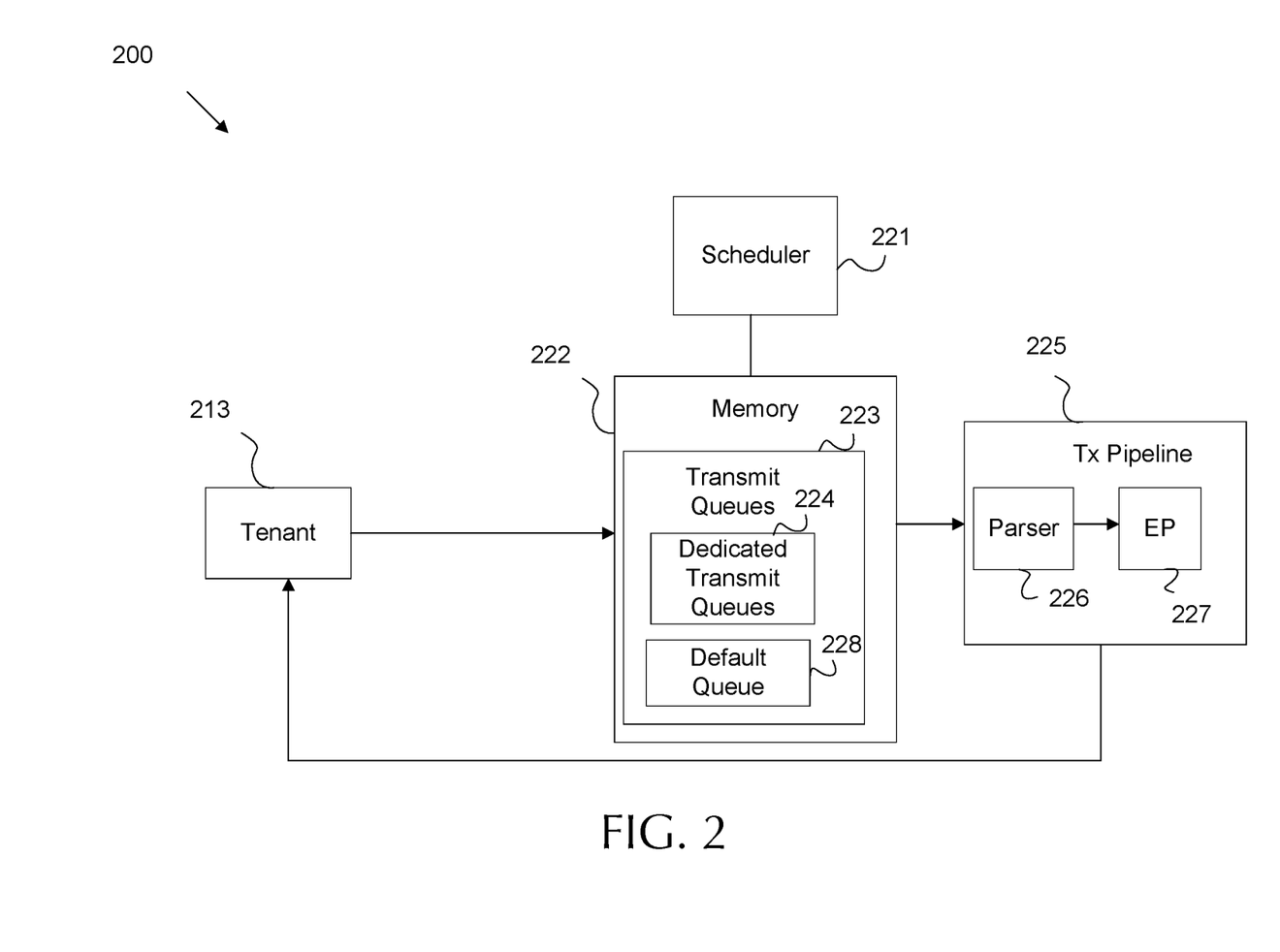
FIG. 2 is a schematic diagram of an example architecture for applying a flow rate limit to a flow.

FIG. 2 is a schematic diagram of an example architecture 200 for applying a flow rate limit to a flow, such as flows 131-132 of network 100. The architecture 200 may be partially contained in a NIC, such as NIC 120. The architecture 200 includes a tenant process 213, a memory 222 organized into a plurality of transmit queues 223, a scheduler 221 coupled to the transmit queues 223, and a transmit pipeline 225 including a parser 226 and a communication end point (EP) 227. The tenant process 213 is substantially similar to tenant process 113 and operates on hardware, such as one or more processors and/or processor clusters in a server (e.g. local server 110). A NIC, containing the scheduler 221, memory 222, and Tx pipeline 225, is coupled to the tenant process 213 via an interface, such as a PCI-E interface, an on-chip interface, etc. The interface may be a mechanism for communicating between a hardware components. It should be noted that a NIC may be an expansion card, a separate chip on a separate die, part of a system on a chip (SoC), and/or an interface integrated onto a common die with a processor.

Memory 222 is any memory for storing data communicated between the tenant process 213 and the NIC via the interface. For example, packets traversing the interface are stored in memory 222 while awaiting further processing prior to transmission over a network. The tenant process 213 may write packets to memory 222 via direct memory access (DMA). The memory 222 is organized into transmit queues 223. The transmit queues 223 store packets from tenants, operating on the server, until such packets can be transmitted across the network. The order of transmission from the transmit queues may be determined by the scheduler 221.

The transmit queues 223 contain a default queue 228. A tenant process 213 may communicate with the transmit queues 223 via a PCI-express physical function (PF) for purposes of resource management. When no transmit queue 223 has been assigned to a connection, for example to carry a flow, flow packets from the tenant process 213 may be transmitted to the default queue 228.

A packet in the default queue 228 is communicated to the Tx pipeline 225 coupled to the transmit queues 223. The Tx pipeline 225 includes many components, and has been simplified for purposes of clarity. The Tx pipeline 225 may include, among other components, a parser 226 and a EP 227. The parser 226 is any component designed to review packet routing (or frame switching) information from a packet/frame header. The parser 226 reviews packets from the default queue 228 to determine a connection entry ID associated with the packet flow. The parser accesses/maintains a mapping table on the NIC associating connections to dedicated transmit queues 224, which is discussed more completely below. Upon receiving a packet of the flow in the default queue 228, the parser obtains a connection entry ID associated with the flow from the packet. If the connection entry ID from a packet in the default queue 228 is associated with a dedicated transmit queue 224, the parser 226 may determine that the packet is in the wrong transmit queue 223 and drop the packet as the packet may be malicious. For any packets that are not dropped, the connection entry ID is forwarded along to the EP 227. It should also be noted that the default queue 228 may be assigned a rate limit to reduce the likelihood that a malicious program would attempt to abuse the non-dedicated nature of the default queue 228. It should be noted that the parser 226 may also review packets from dedicated transmit queues 224, and may drop packets in the wrong dedicated transmit queues 224.

The EP 227 is any component that serves as a communication end point, for example as the end point of a communication tunnel. For example, EP 227 may act as an IP tunnel end point for a communication between a local server and a remote server across an IP network. The EP 227 is designed to perform various flow related actions based on the connection entry ID from the parser 226. When receiving a connection entry ID for a new flow, EP 227 assigns at least one of the plurality of transmit queues 223 to the flow as a dedicated transmit queue 224. Each flow may be defined in terms a tuple. The tuple includes a source of a flow (e.g. the tenant process 213) and a destination of the flow (e.g. a remote server/tenant process). Hence, the dedicated transmit queue 224 may be assigned based on a destination of the flow, based on a source/destination tuple of the flow, and/or based on a tunnel (e.g. tunnel rule/scheme) associated with the flow, such as an IP tunnel, a Virtual Local Area Network (VLAN) tunnel, a Virtual Extensible Local Area Network (VXLAN) tunnel, etc. For example, the EP 227 may assign a transmit queue 223 as a dedicated transmit queue 224 by: determining a queue ID of an unused transmit queue 223; mapping the connection entry ID from the parser 226 to the queue ID of the unused transmit queue 223 to assign the queue as a dedicated transmit queue 224; and storing the mapping in the mapping table on the NIC. The EP 227 may also communicate the dedicated transmit queue 224 to a source of the flow. For example, the EP 227 may communicate the queue ID of the dedicated transmit queue 224 to the tenant process 213 (and/or hypervisor) to cause the tenant process 213 to address further packets of the flow to the specified dedicated transmit queue 224. In such case, the queue ID of the dedicated transmit queue may be sent as part of a completion message after transmitting a packet from the default queue 228. As another example, a transmit queue ID may be forwarded to the corresponding source each time a flow packet is received from a remote entity. The transmit queue ID may be stored in programmable metadata in the received packet. In yet another example, a transmit queue ID may be sent to a source each time a packet is received from the source via interface. The source (e.g. tenant process 213) may store the queue ID as part of a connection context structure, for example in a socket and/or private hash/lookup table.

Once the flow is assigned to a dedicated transmit queue 224, the scheduler 221 may manage the flow according to the flow rate by managing the rate of packets transmitted from the dedicated transmit queue 224. Prior to receiving the first flow packet, a flow rate limit may be received for the flow. For example, the flow rate may be received from a hypervisor, such as hypervisor 111, managing the tenant process 213 operating on the local server 110 and acting as a source of the flow. The EP 227 may receive the flow rate, and upon assigning the dedicated transmit queue 224, relate the flow rate limit to the flow. Hence, the EP 227 may assigning the dedicated transmit queue 224 to the flow based on the flow rate limit. Accordingly, the Tx pipeline 225 may transmit packets of the flow from the dedicated transmit queue 224 over a network, for example via a port such as port 121. The Tx pipeline 225 may transmit packets from the dedicated transmit queues 224 according to instructions from scheduler 221, and may therefore enforce the port rate limits, the tenant rate limits, and the flow rate limits.

The scheduler 221 is any components designed to arbitrate packet/frame switching in a communication network. The scheduler 221 may be coupled to the transmit queues 223. The scheduler 221 may also receive the port rate limit(s) for the port(s), the tenant rate limits for the tenant process(es) 213, and the flow rate limits for the flows, for example from the hypervisor. The scheduler 221 allocates transmit bandwidth from the transmit queues 223 across the Tx pipeline 225. Such allocation is made based on the various rate limits. Hence, the scheduler 221 allocates a flow transmit bandwidth to the dedicated transmit queue 224 to enforce the flow rate limit for the flow assigned to the dedicated transmit queue.

In summary, by assigning a specified flow from a tenant process 213 to a dedicated transmit queue 224, the scheduler 221 and Tx pipeline 225 can apply a flow specific rate limit to the flow. The flow rate limit can be applied without requiring the NIC to review the headers of packets prior scheduling or maintain a dual scheduling system. Further, the NIC can maintain security by causing the parser 226 to drop packets sent to the wrong transmit queue 223. In addition to dropping packets improperly sent to the default queue 223, the parser 223 may also drop packets sent to an improper dedicated transmit queue 224. For example, the parser 223 may periodically check packets in the various transmit queues 223, such as the dedicated transmit queues 224 and/or the default queue 228. The parser 223 may drop an outgoing packet from a dedicated transmit queue 224 when a destination of the outgoing packet does not match the destination of the flow associated with the dedicated transmit queue 224. Further, the parser 223 may drop an outgoing packet from the default queue 228 when the outgoing packet is part of a flow assigned to one of the dedicated transmit queues 224. In other words, for each packet in an incorrect transmit queue 223, the parser 226 drops the packet and/or notifies the scheduler 221 and/or other components in the Tx pipeline 225.

It should also be noted that architecture 200 may be configured to change a tenant process 213 association with a dedicated transmit queue 224 on the fly. For example, a flow being transmitted from an initial source may be dynamically moved to a secondary source (e.g. between tenant processes 213). In such case, the Tx pipeline 225 may receive instructions of such a move (e.g. from a hypervisor, one or more of the tenant processes 213, etc.), for example at the parser 226 and/or via the scheduler 221. The Tx pipeline 225 may reassign the dedicated transmission queue 224 of the flow from the initial source to the secondary source to change the association of the flow.

Figure 3:
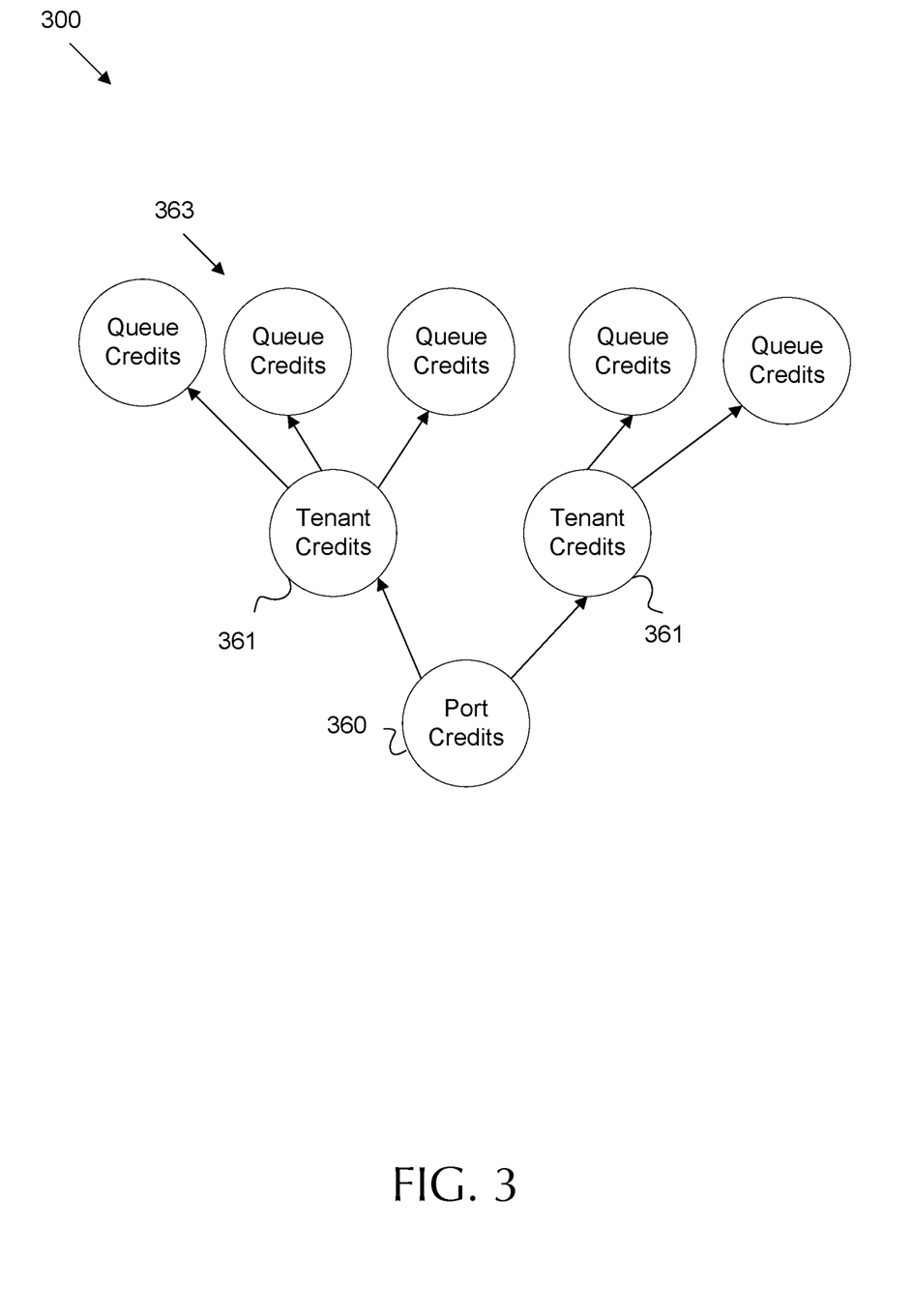
FIG. 3 illustrates a mechanism for employing credits to implement port rate limits, tenant rate limits, and flow rate limits in a scheduler.

FIG. 3 illustrates a mechanism 300 for employing credits to implement port rate limits, tenant rate limits, and flow rate limits in a scheduler, such as scheduler 221. The scheduler receives the port, tenant process, and flow rate limits, and assigns corresponding port credits 360, tenant credits 361, and queue credits, respectively. A credit indicates an amount of bandwidth that can be allocated to communications subject to a corresponding limit. For example, port credits 360 can be assigned to a port to ensure that the aggregate data transmitted over the port does not exceed the port rate limit. As multiple tenant processes may communicate over the same port, the port credits 360 may be sub-divided amongst the tenants as tenant credits 361. The tenant credits are set according to the tenant rate limits. Such a scheme ensures that tenants do not exceed their tenant rate limits and that the aggregate communication by the tenants does not exceed the port rate limit. As multiple flows may originate from the same tenant process, the tenant credits 361 are subdivided in queue credits 363 for the flows. The queue credits 363 are assigned according to the corresponding flow rate limits. Accordingly, the queue credits 363 ensure the flows are limited by their flow rate limits without exceeding the tenant rate limits for the corresponding tenant processes and without exceeding the port rate limits for the port. As such, when packets stored in the transmit queues are transmitted over a port, the scheduler can enforce a port rate limit for communication via the port, a tenant rate limit for communication from the tenant process acting as the source of a flow, and a flow rate limit for the flows stored in the dedicated transmit queues. Further, the port rate limit is set to a value greater than the tenant rate limit. The tenant rate limit is also set to a value greater than the flow rate limit.

Figure 4:
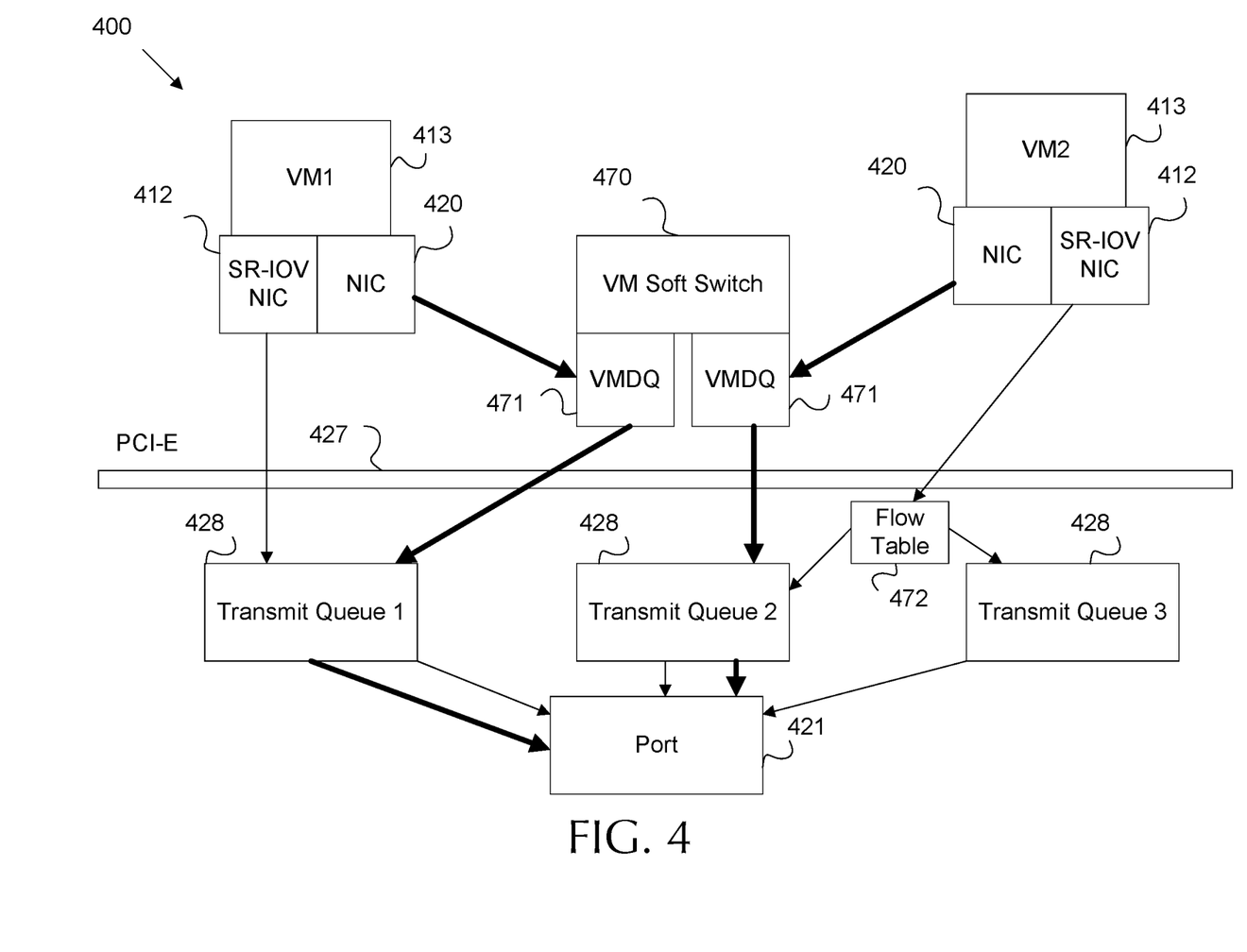
FIG. 4 is a schematic diagram of a system for applying port rate limits, tenant rate limits, and flow rate limits to communications leaving a server.

FIG. 4 is a schematic diagram of a system 400 for applying port rate limits, tenant rate limits, and flow rate limits to communications leaving a server, such as local server 110. System 400 depicts the resulting functionality of architecture 200. A local server 110 may employ VMs 413 as tenant processes. The VMs 413 communicate via a NIC 420 and SR-IOV NIC resources 412 that are dedicated to the VMs 413. Such communication may occur via a PCI-E interface 427. From the tenant process standpoint, the VMs 413 communicate via the NIC 420 by communicating with virtual machine device queues (VMDQs) in a VM soft switch 470. The flows traversing the VMDQs 471 are depicted as bold lines arrows. The VM soft switch 470 routes packets in the VMDQs 471 according to transmit queues 428. The transmit queues 428 are employed to schedule packets transmitted over the port 421 according to tenant rate limits. From a flow standpoint, the VMs 413 communicate via the SR-IOV NIC resources 412 as shown via the non-bolded arrows. Such routing is handled by hardware, and may be handled in a manner that is transparent to the VM soft switch 470. The system 400 employs a flow table 472 to assist in managing such flows. The flows traverse the transmit queues 428. As shown, at the hardware level the flows receive separate transmit queues 428 even when the flows originate from a common VM 413. The separate transmit queues 428 may be implemented with the dedicated transmit queues 224 as described above. The flows receive flow rate limits per target, where target is a destination, network, and/or tunnel. Such a scheme allows the system 400 to respond to congestion, even when port and/or tenant process based rate limits are not exceeded.

Figure 5:
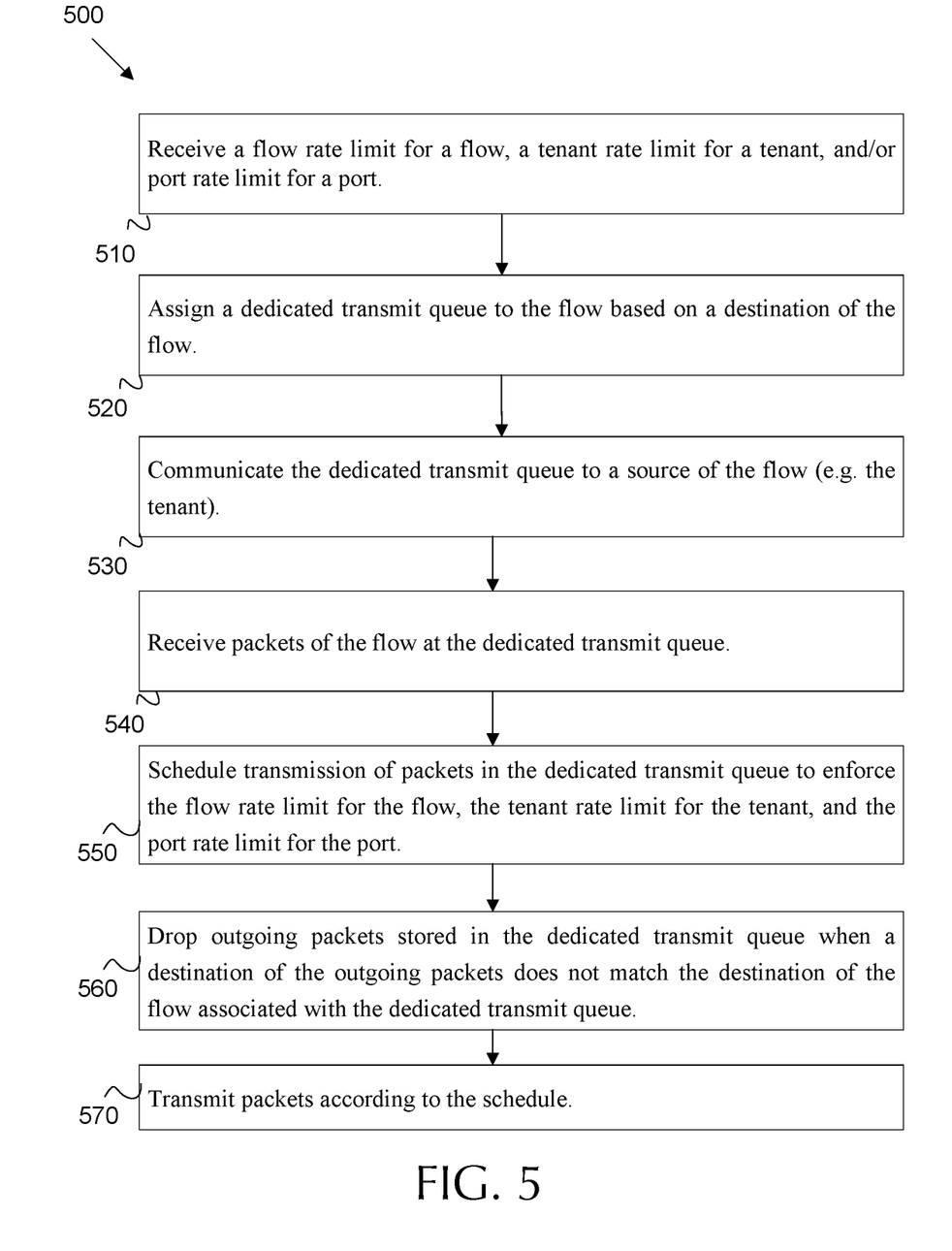
FIG. 5 is a flowchart of an example method for applying a flow rate limit to a flow.

FIG. 5 is a flowchart of an example method 500 for applying a flow rate limit to a flow, for example by employing a local server with a NIC that employs dedicated transmit queues, a scheduler, and a Tx pipeline, such as local server 110, NIC 120, dedicated transmit queues 224, scheduler 221, and Tx pipeline 225, respectively. Method 500 may be employed to implement system 400, for example according to the credits of mechanism 300.

At block 510, a flow rate limit, a tenant rate limit, and/or a port rate limit are received. The flow rate limit may indicate a bandwidth limit for a flow, the tenant rate limit may indicate a bandwidth limit for a tenant process, and the port rate limit may indicate a bandwidth limit for a port. The rate limits may be received at a NIC. Such rate limits may be supplied by a hypervisor. The rate limits may be stored in the NIC in a table for access by a Tx pipeline and/or a scheduler. A packet of a flow may be received, for example via a default queue. At block 520, a dedicated transmit queue is assigned to the flow based on a destination of the flow. The queue may be assigned by a communication EP in the transmit pipeline based on data from a parser. At block 530, the dedicated transmit queue for the flow may be communicated to the source of the flow, for example to the tenant and/or the hypervisor. The communication of block 530 may be accomplished by the EP, the Tx pipeline, the scheduler, or any other component on the NIC.

At block 540, packets of the flow are received at the dedicated transmit queue. At block 550, transmission of the packets in the dedicated transmit queue may be scheduled by a scheduler. The transmission of the packets may be scheduled to enforce the flow rate limit for the flow, the tenant rate limit for the tenant/source of the flow, and the port rate limit for the port. At block 560, the transmit pipeline and/or parser may review the packets in the dedicated transmission queues. Outgoing packets stored in the dedicated transmit queue may be dropped by the NIC, transmit pipeline, and/or parser when the destination for the outgoing packets does not match the destination of the flow associated with the dedicated transmit queue. Security may be maintained by dropping such packets and/or notifying a parser to close the corresponding virtual function. Such actions are taken because packets in the wrong queue may be an indication of a malicious program attempting to subvert rate limits. At block 570, packets in the dedicated transmit queue are transmitted according to the schedule created by the scheduler in order to enforce the various rate limits.

Figure 6:
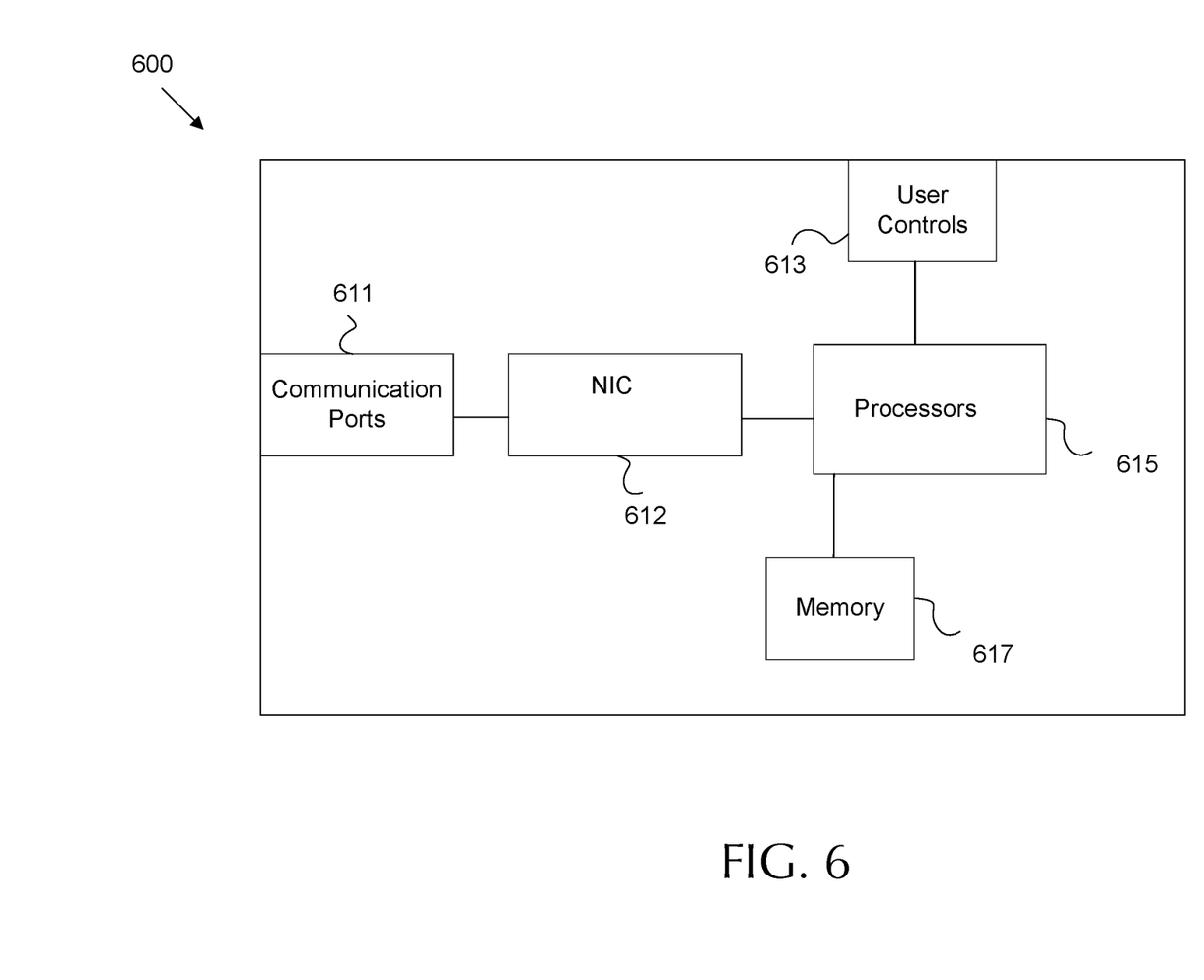
FIG. 6 is a schematic diagram of an example server for use in a cloud network.

FIG. 6 is a schematic diagram of an example server 600 for use in a cloud network 100, such as a local server 110 in a cloud network 100. For example, server 600 may operate tenant processes 113 and include a NIC 120 designed according to architecture 200 that employs mechanism 300 to provide the functionality of system 400 according to method 500. As such, server 600 may be employed to apply flow rate limits (e.g. separate rate limits for each flow) when multiple flows are simultaneously communicated from a common tenant source.

Server 600 includes communication ports 611 which may be any electrical and/or optical ports, or logical sub-divisions thereof, configured to transmit and/or receive flows of data (e.g. packets). Communications ports 611 are coupled to, and/or implemented in, a NIC 612, which may be substantially similar to NIC 120 and may include a scheduler 221, transmit queues 223, and a Tx pipeline 225. NIC 612 may apply flow rate limits to flows communicated from tenant processes operating on processors 615, by implementing method 500 and/or any other method, mechanism, apparatus, and/or system disclosed herein. NIC 612 may be coupled to processors 615 via a PCI-E interface. Processors 615, may be implemented as general purpose processors, application specific integrated circuits (ASICs), digital signal processor (DSPs), Field Programmable Gate Arrays (FPGAs), etc. Processors 615 are configured to execute instructions from memory 617 and may perform any methods and/or associated steps indicated by the instructions, such as operating tenant processes, such as virtual machines and/or containers, and/or operating hypervisors. In some embodiments, the tenant processes and/or hypervisors may be implemented in whole or in part in memory 617 as well. Memory 617 may be implemented as processor cache, random access memory (RAM), read only memory (ROM), solid state memory, hard disk drive(s), or any other memory type. Memory 617 acts as a non-transitory medium for storing data, computer program products, and other instructions, and providing such data/products/instruction to the processor 615 for computation as needed. In some example, the processors 615 and memory 617 may be implemented on the NIC 612 to store and execute computer program products on the NIC 612. User controls 613 are coupled to the processor 615. User controls 613 may include a keyboard, mouse, trackball, and/or any other controls employable by a user to interact with tenant processes and/or hypervisors to manage flows and/or rate limits, such as flow rate limits, port rate limits, and/or tenant rate limits. Such interaction may be performed via a display coupled to the server 600.

It should be noted that the term packet is used herein to discuss both data routed from a NIC via an open system interconnect (OSI) layer three IP protocol and data switched as frames according to an OSI layer two protocol. The usage of the term packet herein should not be construed to exclude usage of other protocols, such as OSI layer two switching. The term packet, as discussed herein, should be construed broadly to encompass such protocols.

Aspects disclosed herein may operate on a particularly created hardware, on firmware, digital signal processors, or on a specially programmed general purpose computer including a processor operating according to programmed instructions. The term processor as used herein is intended to include microprocessors, microcomputers, Application Specific Integrated Circuits (ASICs), and dedicated hardware controllers. One or more aspects of the invention may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), three dimensional cross point (3DXP), etc. As will be appreciated by one of skill in the art, the functionality of the program modules may be combined or distributed as desired in various aspects. In addition, the functionality may be embodied in whole or in part in firmware or hardware equivalents such as integrated circuits, field programmable gate arrays (FPGA), and the like. Particular data structures may be used to more effectively implement one or more aspects of the invention, and such data structures are contemplated within the scope of computer executable instructions and computer-usable data described herein.

EXAMPLES

Illustrative examples of the technologies disclosed herein are provided below. An embodiment of the technologies may include any one or more, and any combination of, the examples described below.

Example 1 includes an apparatus for applying a flow rate limit to a flow, the apparatus comprising: a memory; a transmit pipeline coupled to the memory, the transmit pipeline to: assign at least one of a plurality of transmit queues in the memory to the flow as a dedicated transmit queue based on a destination of the flow, communicate the dedicated transmit queue to a source of the flow, and transmit packets of the flow from the dedicated transmit queue, and a scheduler coupled to the transmit queues, the scheduler to allocate a flow transmit bandwidth to the dedicated transmit queue to enforce the flow rate limit for the flow.

Example 2 includes the apparatus of Example 1, further comprising at least one port for transmitting packets stored in the transmit queues, wherein the scheduler enforces a port rate limit for communication via the port and a tenant rate limit for communication from the source of the flow, the port rate limit and the tenant rate limit set to values greater than the flow rate limit.

Example 3 includes the apparatus of Examples 1-2, wherein the dedicated transmit queue is further assigned based on a tuple for the flow, the tuple including a source of the flow and the destination of the flow.

Example 4 includes the apparatus of Examples 1-3, wherein the dedicated transmit queue is further assigned based on a tunnel associated with the flow.

Example 5 includes the apparatus of Examples 1-4, further comprising a parser to drop an outgoing packet of the flow when a destination of the outgoing packet does not match the destination of the flow associated with the dedicated transmit queue.

Example 6 includes the apparatus of Examples 1-5, further comprising a parser to drop an outgoing packet of the flow from a default queue when a destination of the outgoing packet matches the destination of the flow associated with the dedicated transmit queue.

Example 7 includes the apparatus of Examples 1-6, further comprising a parser to send a notification to close a virtual function associated with the flow when an outgoing packet of the flow is stored in a transmit queue and the outgoing packet includes a destination that does not match a destination assigned to the transmit queue.

Example 8 includes the apparatus of Examples 1-7, wherein the transmit pipeline is further to: receive a packet of the flow, obtain a connection entry identifier (ID) associated with the flow from the packet, and map the connection entry ID to a queue ID of the dedicated transmit queue.

Example 9 includes the apparatus of Examples 1-8, wherein the apparatus is a network interface card coupled to a server, the server to operate a plurality of tenant processes on dedicated hardware resources in single root input/output virtualization (SR-IOV) mode.

Example 10 includes the apparatus of Examples 1-9, wherein the source of the flow is a tenant process operating on a server, and communicating the dedicated transmit queue to the source of the flow includes communication of a queue identifier (ID) of the dedicated transmit queue to the tenant process to cause the tenant process to address packets of the flow to the dedicated transmit queue.

Example 11 includes the apparatus of Examples 1-10, wherein the transmit pipeline includes a tunnel end point to relate the flow rate limit to the flow and assign the dedicated transmit queue to the flow.

Example 12 includes the apparatus of Examples 1-11, wherein the flow rate limit is received from a hypervisor managing a tenant process acting as a source of the flow.

Example 13 includes the apparatus of Examples 1-12, wherein the transmit pipeline communicates the dedicated transmit queue to the source of the flow via a transmit complete message for an initial packet of the flow.

Example 14 includes the apparatus of Examples 1-12, wherein the transmit pipeline communicates the dedicated transmit queue to the source of the flow via metadata in a received packet from the destination of the flow.

Example 15 includes the apparatus of Examples 1-14, wherein the transmit pipeline is further to reassign the dedicated transmission queue from an initial source to a secondary source to change an association of the flow between the initial source and the secondary source.

Example 16 includes a method for applying a flow rate limit to a flow, the method comprising: receiving a flow rate limit for a flow; assigning, by a transmit pipeline, a dedicated transmit queue to the flow based on a destination of the flow; communicating the dedicated transmit queue to a source of the flow; transmitting packets of the flow from the dedicated transmit queue; and allocating, by a scheduler, a flow transmit bandwidth to the dedicated transmit queue to enforce the flow rate limit for the flow.

Example 17 includes the method of Example 16, further comprising: forwarding packets from the dedicated transmit queue over a port limited by a port rate limit set to a value greater than the flow rate limit; and forwarding packets from the source of the flow limited by a tenant rate limit set to a value greater than the flow rate limit.

Example 18 includes the method of Examples 16-17, wherein the dedicated transmit queue is further assigned based on a tuple for the flow, the tuple including a source of the flow and the destination of the flow.

Example 19 includes the method of Examples 16-18, wherein the dedicated transmit queue is further assigned based on a tunnel associated with the flow.

Example 20 includes the method of Examples 16-19, further comprising dropping an outgoing packet of the flow from the dedicated transmit queue when a destination of the outgoing packet does not match the destination of the flow associated with the dedicated transmit queue.

Example 21 includes the method of Examples 16-20, further comprising dropping an outgoing packet of the flow from a default queue when a destination of the outgoing packet matches the destination of the flow associated with the dedicated transmit queue.

Example 22 includes the method of Examples 16-21, further comprising sending a notification to close a virtual function associated with the flow when an outgoing packet of the flow is stored in a transmit queue and the outgoing packet includes a destination that does not match a destination assigned to the transmit queue.

Example 23 includes the method of Examples 16-22, wherein assigning the dedicated transmit queue to the flow includes: receiving a packet of the flow at a parser, obtaining a connection entry identifier (ID) associated with the flow from the packet, and mapping the connection entry ID to a queue ID of the dedicated transmit queue.

Example 24 includes the method of Examples 16-23, wherein the method is implemented on a network interface card coupled to a server, the server for operating a plurality of tenant processes on dedicated hardware resources in single root input/output virtualization (SR-IOV) mode.

Example 25 includes the method of Examples 16-24, wherein the source of the flow is a tenant process operating on a server, and communicating the dedicated transmit queue to the source of the flow includes communicating a queue identifier (ID) of the dedicated transmit queue to the tenant process to cause the tenant process to address packets of the flow to the dedicated transmit queue.

Example 26 includes the method of Examples 16-25, wherein assigning the dedicated transmit queue to the flow includes relating the flow rate limit to the flow and assigning the dedicated transmit queue to the flow based on the flow rate limit.

Example 27 includes the method of Examples 16-26, wherein the flow rate limit is received from a hypervisor managing a tenant process acting as a source of the flow.

Example 28 includes the method of Examples 16-26, wherein the dedicated transmit queue is communicated to the source of the flow via a transmit complete message for an initial packet of the flow.

Example 29 includes the method of Examples 16-26, wherein the dedicated transmit queue is communicated to the source of the flow via metadata in a received packet from the destination of the flow.

Example 30 includes the method of Examples 16-26, further comprising reassigning the dedicated transmission queue from an initial source to a secondary source to change an association of the flow between the initial source and the secondary source.

Example 31 includes a system for applying a flow rate limit to a flow, the system comprising: one or more processors for implementing a tenant process acting as a source of the flow; and a network interface card including: a memory; a transmit pipeline coupled to the memory, the transmit pipeline to: assign at least one of a plurality of transmit queues to the flow as a dedicated transmit queue based on a destination of the flow, communicate the dedicated transmit queue to the tenant process, and transmit packets of the flow from the dedicated transmit queue; and a scheduler coupled to the transmit queues, the scheduler to allocate a flow transmit bandwidth to the dedicated transmit queue to enforce the flow rate limit for the flow.

Example 32 includes the system of Example 31, wherein the processors are further to implement a hypervisor, the hypervisor for communicating the flow rate limit to the network interface card.

Example 33 includes the system of Examples 31-32, wherein the network interface card further includes at least one port for transmitting packets stored in the transmit queues, wherein the scheduler enforces a port rate limit for communication via the port and a tenant rate limit for communication from the tenant process, the port rate limit and the tenant rate limit set to values greater than the flow rate limit.

Example 34 includes the system of Examples 31-33, wherein the dedicated transmit queue is further assigned based on a tuple for the flow, the tuple including a source of the flow and the destination of the flow.

Example 35 includes the system of Examples 31-34, wherein the dedicated transmit queue is further assigned based on a tunnel associated with the flow.

Example 36 includes the system of Examples 31-35, wherein the transmit pipeline further includes a parser to drop an outgoing packet when a destination of the outgoing packet does not match the destination of the flow associated with the dedicated transmit queue.

Example 37 includes the system of Examples 31-36, wherein the transmit pipeline further includes a parser to drop an outgoing packet of the flow from a default queue when a destination of the outgoing packet matches the destination of the flow associated with the dedicated transmit queue.

Example 38 includes the system of Examples 31-37, wherein the transmit pipeline further includes a parser to send a notification to close a virtual function associated with the flow when an outgoing packet of the flow is stored in a transmit queue and the outgoing packet includes a destination that does not match a destination assigned to the transmit queue.

Example 39 includes the system of Examples 31-38, wherein the transmit pipeline is further to: receive a packet of the flow, obtain a connection entry identifier (ID) associated with the flow from the packet, and map the connection entry ID to a queue ID of the dedicated transmit queue.

Example 40 includes the system of Examples 31-39, wherein the processors operate the tenant processes on dedicated hardware resources and communicate with the network interface card in single root input/output virtualization (SR-IOV) mode.

Example 41 includes the system of Examples 31-40, wherein communicating the dedicated transmit queue to the tenant process includes communicating a queue identifier (ID) of the dedicated transmit queue to the tenant process to cause the tenant to address packets of the flow to the dedicated transmit queue.

Example 42 includes the system of Examples 31-41, wherein the transmit pipeline includes a tunnel end point to relate the flow rate limit to the flow and assign the dedicated transmit queue to the flow.

Example 43 includes the system of Examples 31-42, wherein the transmit pipeline communicates the dedicated transmit queue to the source of the flow via a transmit complete message for an initial packet of the flow.

Example 44 includes the system of Examples 31-42, wherein the transmit pipeline communicates the dedicated transmit queue to the source of the flow via metadata in a received packet from the destination of the flow.

Example 45 includes the system of Examples 31-44, wherein the transmit pipeline is further to reassign the dedicated transmission queue from an initial source to a secondary source to change an association of the flow between the initial source and the secondary source. The previously described versions of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. For example, where a particular feature is disclosed in the context of a particular aspect or embodiment, that feature can also be used, to the extent possible, in the context of other aspects and embodiments.

Also, when reference is made in this application to a method having two or more defined steps or operations, the defined steps or operations can be carried out in any order or simultaneously, unless the context excludes those possibilities.

Although specific embodiments of the invention have been illustrated and described for purposes of illustration, it will be understood that various modifications may be made without departing from the spirit and scope of the invention. Accordingly, the invention should not be limited except as by the appended claims.

We claim:

1. An apparatus comprising:
   first circuitry to:
   assign at least one of a plurality of transmit queues to a flow as a dedicated transmit queue based on a destination of the flow,
   communicate the dedicated transmit queue to a source of the flow, wherein the source of the flow comprises a process that requested transmission of at least one packet associated with the flow, and
   transmit packets of the flow from the dedicated transmit queue, and
   second circuitry coupled to the transmit queues, the second circuitry to allocate a flow transmit bandwidth to the dedicated transmit queue to enforce a flow rate limit for the flow.

2. The apparatus of claim 1, further comprising at least one port for transmitting packets stored in the transmit queues, wherein the second circuitry is to enforce a port rate limit for communication via the port and a tenant rate limit for communication from the source of the flow, the port rate limit and the tenant rate limit set to values greater than the flow rate limit.

3. The apparatus of claim 1, wherein the dedicated transmit queue is further assigned based on a tuple for the flow, the tuple including a source of the flow and the destination of the flow.

4. The apparatus of claim 1, wherein the dedicated transmit queue is further assigned based on a tunnel associated with the flow.

5. The apparatus of claim 1, further comprising a parser to drop an outgoing packet of the flow when a destination of the outgoing packet does not match a destination of the flow associated with the dedicated transmit queue.

6. The apparatus of claim 1, further comprising a parser to drop an outgoing packet of the flow from a default queue when a destination of the outgoing packet matches a destination of the flow associated with the dedicated transmit queue.

7. The apparatus of claim 1, further comprising a parser to send a notification to close a virtual function associated with the flow when an outgoing packet of the flow is stored in a transmit queue and the outgoing packet includes a destination that does not match a destination assigned to the transmit queue.

8. The apparatus of claim 1, wherein the first circuitry is further to:
   receive a packet of the flow,
   obtain a connection entry identifier (ID) associated with the flow from the packet, and
   map the connection entry ID to a queue ID of the dedicated transmit queue.

9. The apparatus of claim 1, comprising a network interface card coupled to a server, the server to operate a plurality of tenant processes on dedicated hardware resources in single root input/output virtualization (SR-IOV) mode.

10. The apparatus of claim 1, wherein a source of the flow comprises a tenant process that is to operate on a server, and communicate the dedicated transmit queue to the source of the flow includes communicate a queue identifier (ID) of the dedicated transmit queue to the tenant process to cause the tenant process to address packets of the flow to the dedicated transmit queue.

11. The apparatus of claim 1, wherein the first circuitry includes an end point to relate the flow rate limit to the flow and assign the dedicated transmit queue to the flow.

12. The apparatus of claim 1, wherein the first circuitry is to communicate the dedicated transmit queue to the source of the flow via a transmit complete message for an initial packet of the flow.

13. The apparatus of claim 1, wherein the first circuitry is to communicate the dedicated transmit queue to a source of the flow via metadata in a received packet from the destination of the flow.

14. The apparatus of claim 1, wherein the first circuitry is further to reassign the dedicated transmit queue from an initial source to a secondary source to change an association of the flow between the initial source and the secondary source.

15. A method comprising:
    receiving a flow rate limit for a flow;
    assigning, by a transmit pipeline, a dedicated transmit queue to the flow based on a destination of the flow;
    communicating the dedicated transmit queue to a source of the flow, wherein the source of the flow comprises a process that requested transmission of at least one packet associated with the flow;
    transmitting packets of the flow from the dedicated transmit queue; and
    allocating, by a scheduler, a flow transmit bandwidth to the dedicated transmit queue to enforce the flow rate limit for the flow.

16. The method of claim 15, further comprising:
    forwarding packets from the dedicated transmit queue over a port limited by a port rate limit set to a value greater than the flow rate limit; and
    forwarding packets from the source of the flow limited by a tenant rate limit set to a value greater than the flow rate limit.

17. The method of claim 15, wherein assigning the dedicated transmit queue to the flow includes:
    receiving a packet of the flow at a parser,
    obtaining a connection entry identifier (ID) associated with the flow from the packet, and
    mapping the connection entry ID to a queue ID of the dedicated transmit queue.

18. The method of claim 15, wherein the source of the flow is a tenant process operating on a server, and communicating the dedicated transmit queue to the source of the flow includes communicating a queue identifier (ID) of the dedicated transmit queue to the tenant process to cause the tenant process to address packets of the flow to the dedicated transmit queue.

19. The method of claim 15, wherein assigning the dedicated transmit queue to the flow includes relating the flow rate limit to the flow and assigning the dedicated transmit queue to the flow based on the flow rate limit.

20. A system comprising:
    one or more processors to execute a tenant process that is a source of a flow of packets; and
    a network interface card including:
    a transmit pipeline to:
    assign at least one of a plurality of transmit queues to the flow as a dedicated transmit queue based on a destination of the flow, communicate the dedicated transmit queue to the tenant process, wherein the tenant process requests transmission of at least one packet associated with the flow, and transmit packets of the flow from the dedicated transmit queue; and a scheduler coupled to the transmit queues, the scheduler to allocate a flow transmit bandwidth to the dedicated transmit queue to enforce a flow rate limit for the flow.

21. The system of claim 20, wherein the one or more processors are further to implement a hypervisor, the hypervisor to communicate the flow rate limit to the network interface card.

22. The system of claim 20, wherein the transmit pipeline further includes a parser to drop an outgoing packet when a destination of the outgoing packet does not match the destination of the flow associated with the dedicated transmit queue.

23. The system of claim 20, wherein the transmit pipeline is further to:

receive a packet of the flow, obtain a connection entry identifier (ID) associated with the flow from the packet, and map the connection entry ID to a queue ID of the dedicated transmit queue.

24. The system of claim 20, wherein the communicate the dedicated transmit queue to the tenant process includes communicate a queue identifier (ID) of the dedicated transmit queue to the tenant process to cause the tenant process to address packets of the flow to the dedicated transmit queue.

25. The system of claim 20, wherein the transmit pipeline includes a tunnel end point to relate the flow rate limit to the flow and assign the dedicated transmit queue to the flow.

26. The apparatus of claim 1, wherein the source of the flow is to direct one or more packets to the dedicated transmit queue based on the communication of the dedicated transmit queue.

* * * * *